(12) United States Patent
Ausserlechner

(10) Patent No.: US 7,643,363 B2
(45) Date of Patent: Jan. 5, 2010

(54) CONCEPT FOR TESTING AN INTEGRATED CIRCUIT

(75) Inventor: Udo Ausserlechner, Villach (AT)

(73) Assignee: Infineon Technologies AG, Munich (DE)

( * ) Notice: Subject to any disclaimer, the term of this patent is extended or adjusted under 35 U.S.C. 154(b) by 514 days.

(21) Appl. No.: 11/668,695

(22) Filed: Jan. 30, 2007

(65) Prior Publication Data

US 2007/0234141 A1 Oct. 4, 2007

(30) Foreign Application Priority Data

Jan. 30, 2006 (DE) ........................ 10 2006 004 247

(51) Int. Cl.
*G11C 29/00* (2006.01)
(52) U.S. Cl. ...................... 365/201; 365/191; 365/198; 365/205; 365/206
(58) Field of Classification Search ................ 365/201, 365/191, 198, 205, 206
See application file for complete search history.

(56) References Cited

U.S. PATENT DOCUMENTS 6,314,034 B1 * 11/2001 Sugamori .................... 365/201
6,563,751 B1 * 5/2003 Wu ............................. 365/201
7,414,904 B2 * 8/2008 Ehrenreich et al. .......... 365/201

* cited by examiner

*Primary Examiner*—Pho M. Luu
(74) *Attorney, Agent, or Firm*—Eschweiler & Associates, LLC

(57) ABSTRACT

An integrated circuitry operable in a normal and test mode has a processing circuit, an output circuit associated with the processing circuit and a storage with a plurality of memory cells. The output circuit is formed to process in normal mode an output signal of the processing circuit and to provide a processed output signal to an output terminal. The output circuit further provides in test mode a test signal as processed output signal based on a drive signal which may be supplied externally or from the processing circuit. The storage receives in test mode the test signal and performs an evaluation of a memory property of at least one memory cell of the plurality of memory cells based on the test signal, and, in response to this evaluation, to output an evaluation signal indicating the memory property of the at least one cell of the plurality of memory cells.

18 Claims, 3 Drawing Sheets

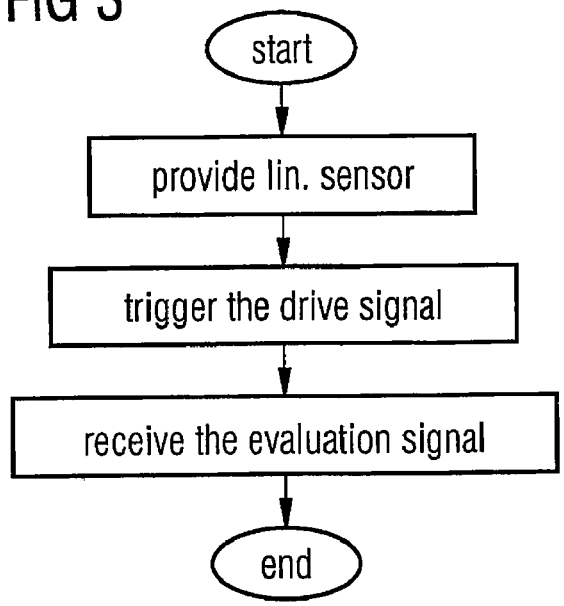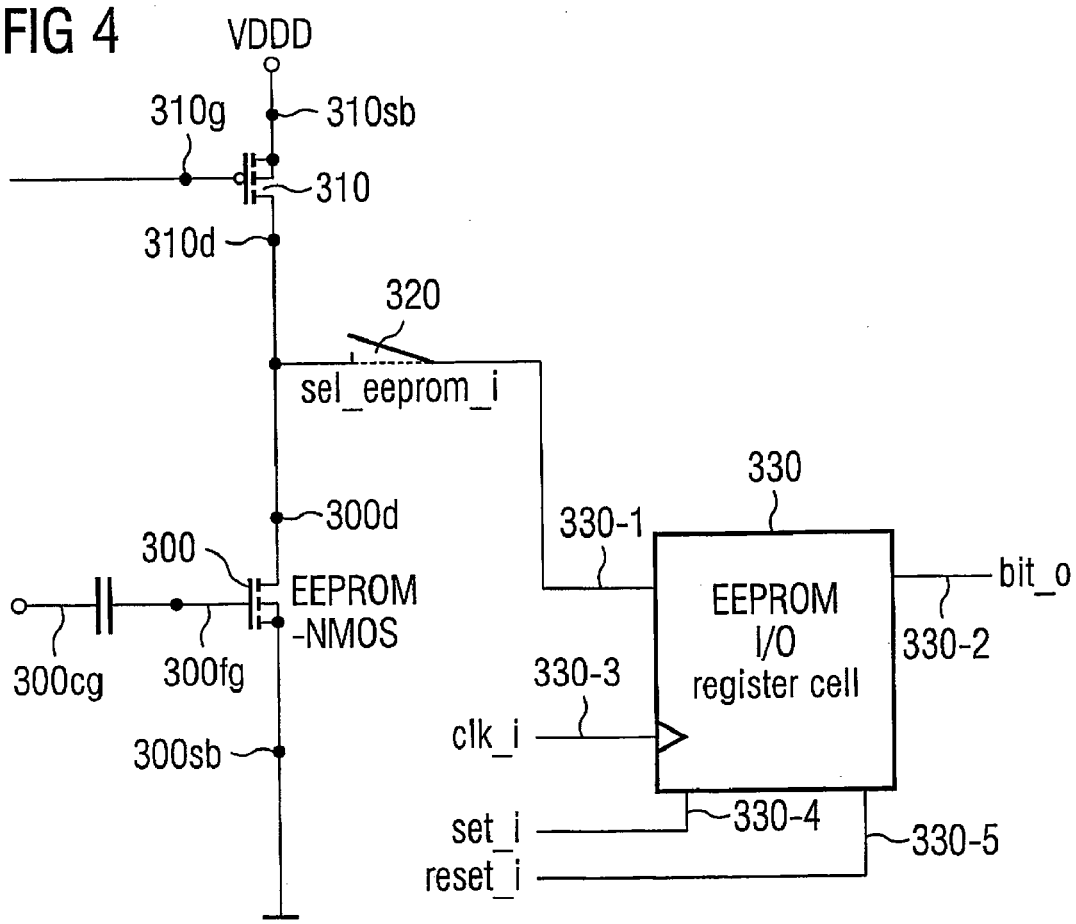

CONCEPT FOR TESTING AN INTEGRATED CIRCUIT

CROSS-REFERENCE TO RELATED APPLICATIONS

This application claims priority from German Patent Application No. 10 2006 004 247.6, which was filed on Jan. 30, 2006, and is incorporated herein by reference in its entirety.

TECHNICAL FIELD

The present invention relates to a concept for testing an integrated circuitry operable in a normal operation mode and a test operation mode, and particularly to an integrated circuitry with storage means for storing associated data amounts, such as integrated sensors with associated memory elements.

BACKGROUND

There are cases of application for integrated circuits (ICs) and sensors in particular, in which a "small" EEPROM memory with a magnitude of about 10-1000 bits is integrated in an integrated circuit. Examples are integrated circuits for analog applications, in which, however, extremely high accuracy is achieved only because of a calibration after a package process, i.e. after a chip with the integrated circuit was housed in a package, for example by casting. Such a housing process is also referred to as package process. The most prominent examples of such integrated circuits with a small EEPROM memory (EEPROM=electrically erasable programmable read-only memory) for analog applications are maybe integrated sensors, such as pressure sensors and magnetic field sensors. However, integrated circuits that have to measure and monitor voltages of rechargeable batteries in a very exact way also belong to this group.

Since the EEPROM memory of such an integrated circuit is comparatively small-sized as compared to a "pure" memory device whose substantial purpose of usage is the storage of data, and the whole integrated circuit and/or the whole IC is rather "small" and compact, an effort is made to avoid the otherwise usual high control effort for providing, for example, the programming voltage, both for reasons of performance and for reasons of cost. It is often usual to generate the necessary programming voltages and the necessary programming ramps not on the chip itself, i.e. on-chip, as it is done in larger memories in the kilobyte range (KB range) and the megabyte range (MB range) with complex charge pump arrangements, but to provide them to the chip externally via a pin and/or a pad.

In addition, it is necessary to detect the charge state and/or the storage capability and/or also other memory properties of each bit of the EEPROM memory at least for test purposes. Such a test is the so-called margin test, in which a test voltage Vmargin (margin voltage) is connected to the same pin to which there is also applied the programming voltage when the EEPROM memory is programmed. In the case of the margin test, this voltage is connected through to a control gate of an EEPROM cell by the same switches as this is also done with the programming circuit in the programming case. As soon as the voltage at the pin has stably settled, a read-out impulse (latch impulse) is communicated and/or transferred to the integrated circuit. Then the charge state of the EEPROM cell is digitally evaluated by the latch impulse. Afterwards, this digital evaluation of the charge state is communicated to the outside as a digital value, for example via the data interface of the integrated circuit.

In this context, it is particularly disadvantageous and problematic that the voltage at the respective pin, i.e. the programming pin, has to be settled very precisely, so that there will advantageously be no corruption of characteristic voltages with respect to the EEPROM cell, or only very little corruption.

However, this takes some time, because relatively long lines and/or leads of the tester, with whose help such a test is performed, are applied to the pin. The length of such a settling phase is significantly influenced by the electrical properties of the tester, the leads and the integrated circuits. These properties include, among other things, the electric resistance, the electric capacitance and the electric inductance of the leads.

SUMMARY

According to an embodiment, a concept for testing an integrated circuitry allowing faster and more exact performance of such a test may be provided by an integrated circuitry operable in a normal operation mode and in a test operation mode, comprising processing circuit means; output circuit means associated with the processing circuit means; and storage means with a plurality of memory cells, wherein the output circuit means is formed to process an output signal, in the normal operation mode, from the processing circuit means and provide a processed output signal at an output terminal of the integrated circuitry; wherein the output circuit means is further formed to provide, in the test operation mode, a test signal as the processed output signal based on a drive signal that may be supplied externally or from the processing circuit means; and wherein the storage means is formed to receive, in the test operation mode, the test signal and perform an evaluation of a memory property of at least one memory cell of the plurality of memory cells based on the test signal, and, in response to this evaluation, to output an evaluation signal indicating the memory property of the at least one memory cell of the plurality of memory cells.

BRIEF DESCRIPTION OF THE DRAWINGS

Preferred embodiments of the present invention will be explained in more detail below with reference to the accompanying drawings, in which:

FIG. 3 is a flow diagram of an embodiment of the method for testing an integrated circuitry; and FIG. 4 is a block circuit diagram for the more detailed explanation of the procedure for a margin test.

DETAILED DESCRIPTION

Figure 1:
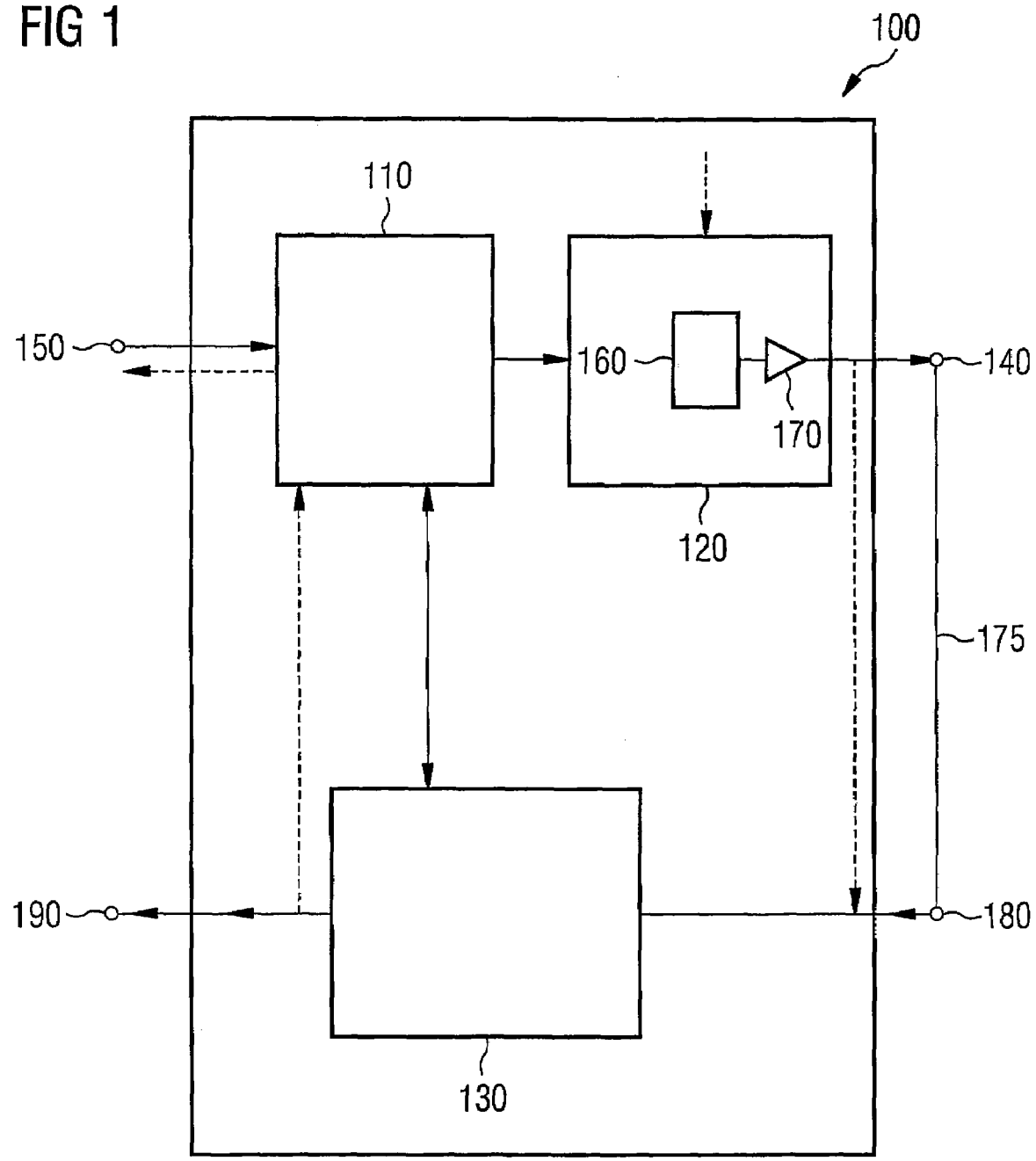
FIG. 1 is a block circuit diagram of an embodiment of an integrated circuitry.

According to different embodiments, a concept for testing a memory property of an integrated circuitry may be significantly accelerated and performed in a more exact way, when the test signal is generated by an output circuit means of the integrated circuitry and is provided to the storage means with a plurality of memory cells, so that the storage means may output, based on the test signal, an evaluation signal indicating a memory property of at least one memory cell of the plurality of memory cells therewith and/or an evaluation of the memory property.

According to an embodiment, it can be particular advantageous that leads of a tester to the integrated circuitry with spurious electric properties may be omitted, so that the test of the memory properties may be significantly accelerated by using a low-resistance connection between the output circuit means and the storage means.

According to an embodiment, both a potential at a drain terminal or a source terminal of an EEPROM cell, a logical signal indicating a through-connection of an EEPROM cell, and an address signal of a memory cell of the plurality of memory cells indicating a change of the contents of the respective memory cell may be used as evaluation signal.

According to an embodiment, the integrated circuitry may comprise a drive terminal, which may be coupled to a processing circuit means or to the output circuit means so as to allow a drive signal to be supplied to the output circuit means directly or via the processing circuit means, so that a test of the memory properties of at least one memory cell of the plurality of memory cells may be further automated and thus further accelerated.

With reference to FIGS. 1-4, an embodiment of an integrated circuitry will now be described, with which the concept for testing an integrated circuitry may be performed. In FIGS. 1-4, the same reference numerals are used for elements with the same or similar functional properties, wherein the corresponding descriptions and explanations are thus mutually applicable and exchangeable.

The present application is structured as follows: first an integrated circuitry according to an embodiment will be described in connection with FIG. 1, before a test means necessary for a test of the integrated circuitry of FIG. 1 will be described and explained in more detail in connection with FIG. 2. Then a method for a test of an integrated circuitry will be described in connection with FIG. 3. Next, a corresponding margin test of a storage means of an integrated circuitry according to an embodiment will be explained in more detail in connection with FIG. 4.

As a first embodiment of an integrated circuitry, FIG. 1 shows a linear sensor 100 with a processor and/or a processing circuit means 110, an output circuit means 120 and/or output means 120 associated with the processing circuit means 110, and a storage means 130 and/or a memory 130 with a plurality of memory cells. The processor 110 is coupled to the output means 120 so that it processes an output signal output by the processor 110 and provides it as a processed output signal to an output terminal 140 of the linear sensor 100. The processor 110 is additionally coupled to a data terminal 150, from which the processor 110 may receive data. Furthermore, the processor 110 is coupled to the memory 130 via a bi-directional connection, so that the processor 110 may obtain data stored in the memory 130 from the memory 130 upon a memory request signal.

In normal operation mode, the processor 110 receives, from a sensor element not shown in FIG. 1, which may be, for example, a pressure sensor element, a magnetic field sensor element or another sensor element, a measurement signal which the processor 110 converts to an output signal, which is typically a digital output signal, based on the data stored in the storage means 130, and provides to the output means 120. The output means 120, which, for this purpose, comprises, for example, a digital/analog converter (DAC) 160 and an operational amplifier 170 coupled thereto, processes the output signal and provides it at the output terminal 140 as processed output signal. In order to achieve this, the operational amplifier 170 is coupled to the output terminal 140 on the output side. The output means 120 thus process the digital output signal to an analog processed output signal then provided at the output terminal 140.

The processor 110 corrects measurement data coming from the sensor element, for example with respect to environmental influences, aging influences or other influences correctable by a use of corresponding models (e.g. pressure models) on the basis of data deposited in the memory 130. The corrections of the processor 110 based on the data deposited in the memory 130 (e.g. calibration data) allow to achieve an extremely high accuracy with respect to the output measurement data of the sensor. Examples of correctable environmental influences are voltage fluctuations of the supply voltage, temperature influences that have to be detected by a corresponding temperature sensor element, pressure influences (piezo influences), aging influences, etc.

A very frequent source of such fluctuations and influences are package processes, in which a semiconductor chip is housed with the linear sensor 100 in a package for a form that is easier to handle. This step is also referred to as package process and often accompanies the casting of the chip, which, due to the curing of the casting compound and different thermal expansion coefficients of the casting compound and the semiconductor chip, may cause stress on the chip, which make a "subsequent" calibration process necessary after the package process. The corresponding calibration data may then be deposited in the memory 130.

However, before the finished sensor 100 is subjected to calibration, the memory 130 is first tested for its functionality and/or other properties. This test may be performed both prior to a dicing step, i.e. on the wafer level, wherein a wafer in this case includes a plurality of linear sensors 100, after the dicing, but prior to the package process, i.e. on the chip level, or after the package process on the finished IC device. In order to perform such a test on an integrated circuitry 100 according to an embodiment in the form of a linear sensor 100, the linear sensor 100 is operated in a test operation mode by connecting the output terminal 140 to a programming terminal 180 coupled to the memory 130 via a low-resistance connection 175 associated with a tester, to supply a test signal generated by the output means 120 to at least one memory cell of the plurality of memory cells of the memory 130. The output means 120 is caused to supply the test signal by a drive signal communicated to the output means 120 from the processor 110. After the reception of the test signal by the memory 130, the latter outputs an evaluation signal at an evaluation signal output 190, which is coupled to the memory 130.

The evaluation signal provided at the evaluation signal output 190 from the memory 130 may be, for example, a characteristic voltage value of a memory cell of the plurality of memory cells of the memory 130. In addition, the evaluation signal may also be other signals which will be discussed in more detail later in the present application.

As an alternative to the embodiment of the linear sensor 100 shown in FIG. 1, it may also be implemented without an additional evaluation signal output 190 if, for example, the memory 130 outputs the evaluation signal also to the processor 110, which then outputs the evaluation signal 100 to the data terminal 150, for example, in digital form. This optional possibility is indicated in FIG. 1 as a dashed line connecting the evaluation signal output 190 and/or the memory 130 to the processor 110 on the one hand, and by the dashed line connecting the processor 110 and the data terminal 150.

A further optional possibility is not to drive the processor 110 so that it outputs the drive signal to the output means 120, but to supply the drive signal directly to the output means 120. This is also indicated in FIG. 1 by a dashed line ending at the output means 120.

In addition, another conceivable option is to connect the output means 120 to the memory 130 avoiding the output terminal 140, also referred to as out pin 140, wherein this is indicated by the dashed line connecting the output of the output means 120 and the programming terminal 180. In this case, the implementation of the programming terminal 180 may be omitted as a further option.

These options, which may be implemented additionally or alternatively, will be explained in more detail later in the present application. In this context, there will also be presented the advantages resulting therefrom.

Without an implementation of the programming terminal 180, it is advantageous to introduce three additional switch means not shown in FIG. 1, to allow the output of the processed output signal, the application of a programming signal to the memory 130 and optionally also the application of an external test signal to the memory 130 as part of a margin test. These three switch means are, for example, high-voltage switches, which allow the safe disconnection and/or connection of individual parts of the integrated circuitry even at voltages of up to 50 volts or more.

A possible technical realization could be to connect the first one of these three switch means between the output means 120 and the branching point of the optional connection drawn as a dashed line in FIG. 1. The second switch means is then to be arranged between the memory 130 and the branching point of the optional connection. The third switch means is to be connected between the branching point and the output terminal 140, which, in this case, may also serve as programming terminal and as feed terminal of an optional external test signal as part of a margin test.

In the normal operation mode, i.e. when the processed output signal of the output means should be present at the output terminal 140, the first and the third switch means are closed, and the second switch means is open. In this way, the memory 130 is disconnected from the output terminal 140, and the processed output signal may reach the output terminal 140.

In the programming mode, the first switch means is opened and the second and third switch means are closed. In this way, an (externally supplied) programming signal may go from the output terminal 140 to the memory 130 without being supplied to the output means 120 as well.

As part of the margin test, i.e. as part of the test operation mode, the first and the second switch means are closed to connect through the test signal provided by the output means 120 to the memory 130. The third switch means may optionally be closed or opened, depending on whether the margin test voltage is to be externally monitored and/or measured at the output terminal 140. If, however, in an external test operation mode, the margin test voltage is to be provided externally to the memory 130 via the output terminal 140, the same switch means configuration is used as in the case of the programming mode. Thus the first switch means is opened to disconnect the output means 120 from the output terminal 140, while the second and third switch means are closed to allow supplying the external test signal to the memory 130.

Figure 2:
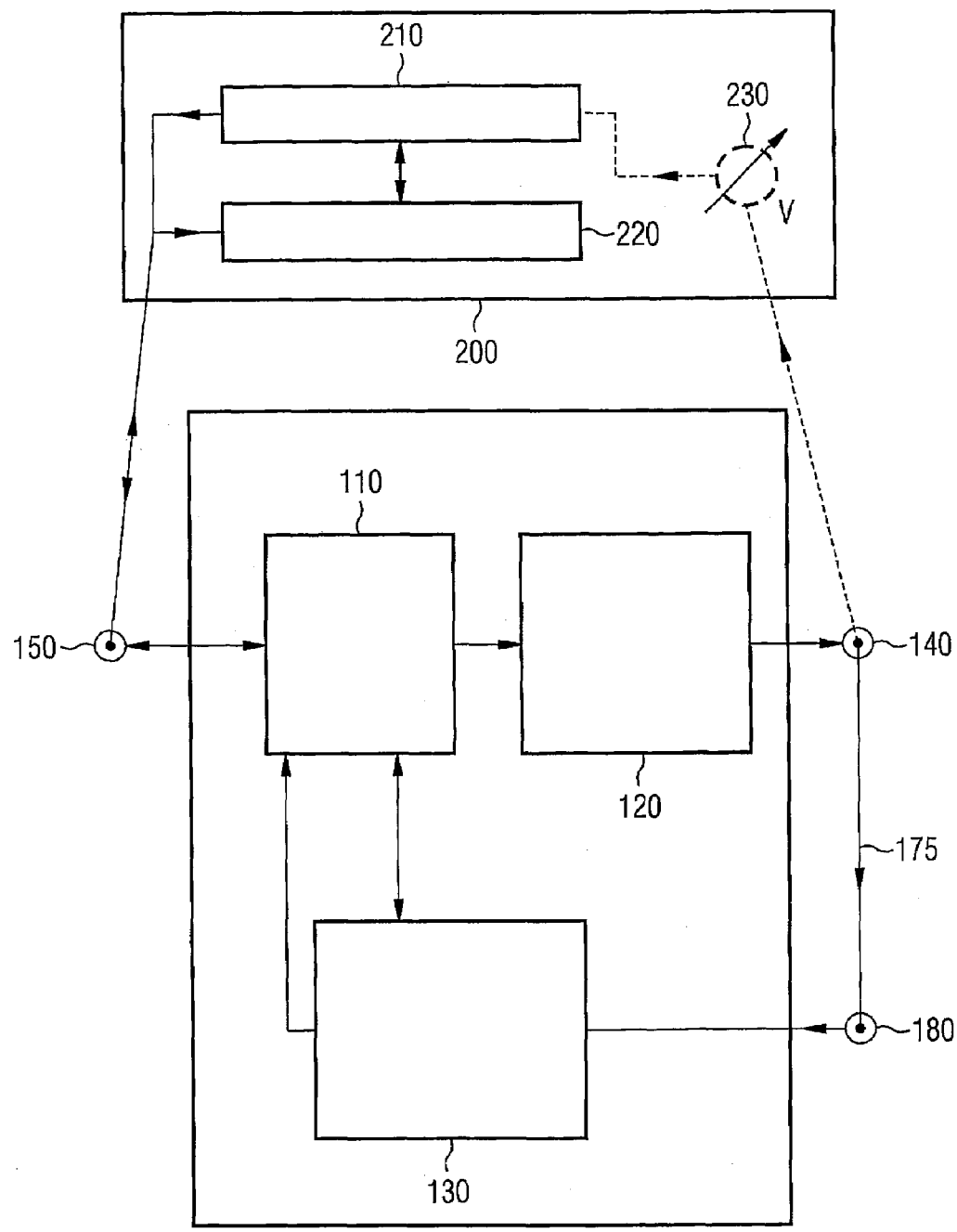
FIG. 2 is a block circuit diagram of an embodiment of an integrated circuitry and an embodiment of an test means.

FIG. 2 shows a schematic block circuit diagram of a tester (test means) 200 coupled to a linear sensor 100 in the test operation mode. The linear sensor 100 shown in FIG. 2 is an integrated circuitry 100, in which the evaluation signal output 190 of FIG. 1 was not implemented, but in which the optional connection of the memory 130 is connected to the processor 110 to provide the evaluation signal, for example in digital form, to the data terminal 150. The tester 200 comprises a drive signal generation means 210 and an evaluation signal detection means 220, which are both coupled to the data terminal 150 of the linear sensor 100 and connected to each other to be able to exchange data among each other as part of a test of an integrated circuit. Via the low-resistance connection 175, which advantageously also belongs to the tester 200, the output terminal 140 is coupled or, more specifically, shorted to the programming terminal 180 of the linear sensor 100. Additionally, the tester 200 may include, as optional component, a voltage detection means 230 in the form of a voltmeter connected to the output terminal 140 of the linear sensor 100. As both the voltmeter 230 and the connection of the voltmeter 230 to the output terminal 140 of the linear sensor 100 are considered to be optional, both the connection and the voltmeter 230 are shown in dashed lines.

The tester 200 may be implemented as a needle tester or a wafer prober for a test on the wafer level or on the chip level. For tests of the IC devices obtained after the package process, the tester 200 may be implemented as a tester with a corresponding socket for the IC device, wherein the tester 200 may be designed so that the IC device may be changed automatically or manually.

The test performed by the tester 200 is now performed substantially as follows. At first, the linear sensor 100 is put into a test operation mode (test mode). Next, the drive signal generator 210 generates a generally digital command sequence as a drive signal which is passed to the data terminal 150 and on to the processor 110 via the connection. On the basis of this drive signal, the processor 110 now generates an output signal, which is processed by the output means 120 and provided as a test signal at the output terminal 140.

Via the conductive connection 175 associated with the tester 200, the test signal is passed from the output terminal 140 to the programming terminal 180 and on to the memory 130. In the memory 130, the test signal is supplied to at least one memory cell of the plurality of memory cells, whereupon the memory 130 outputs an evaluation signal, which it communicates to the processor 110. The processor 110, in turn, passes it on to the data output 150 and thus to the tester 200. The evaluation signal, which is preferably a digital signal in this embodiment, is detected and evaluated by the evaluation signal detection means 220. Depending on the programming of the tester 200, the test of the connected linear sensor 100 may be continued via a direct connection of the drive signal generator 210 and the evaluation signal detection means 220, or the linear sensor 100 may be exchanged for a new device.

A further process and implementation according to an embodiment involving the optional components illustrated in dashed lines in FIG. 2 is that the tester 200 monitors the test signal output at the output terminal 140 by the voltmeter 230, after the drive signal generator 210 has communicated the drive signal to the processor 110. If, for example, the voltmeter 230 exhibits sufficiently little change of the test signal as a function of time, due to a coupling of the voltmeter 230 to the drive signal generator 210, the latter may pass a read-out impulse on to the data terminal 150, which causes the processor 110 to access a certain memory cell of the memory 130, so that the test of the memory properties is directed to this memory cell of the memory 130. Subsequently, the evaluation signal is now again received by the processor 110 and passed on to the evaluation signal detection means 220 via the data terminal 150.

FIG. 3 shows a flow diagram of the method according to an embodiment for testing an integrated circuitry. In a first method step, a linear sensor 100 is provided. Next, the drive signal is triggered in a second method step. In a third method step, the evaluation signal output by the integrated circuitry 100 is received.

As already discussed in the introductory sections of the present application, there are cases of application in which a "small" EEPROM memory (electrically erasable programmable read-only memory) of a magnitude of about 10-1000 bits is integrated into an integrated circuit. Examples for this are integrated circuits for analog applications, in which, however, the extremely high accuracy is only achieved due to a calibration after the package process. Examples thereof are integrated sensors, i.e. for example pressure sensors and magnetic field sensors.

The concept according to an embodiment now allows to use components of the linear sensor to generate voltage ramps and/or voltage values on-chip, and to apply them to the EEPROM memory via the programming terminal 180 (pin) for test purposes via a low-resistance connection 175. In this way, the charge state of each bit of the memory 130, i.e. of each memory cell, may be detected for test purposes. In this way, the concept according to an embodiment allows to perform a margin test and/or a limit voltage test in a quick, efficient and very precise way.

FIG. 4 shows a section of the memory 130 with an individual memory cell and/or EEPROM cell 300, which is more specifically an EEPROM-NMOS transistor (EEPROM transistor). The EEPROM transistor 300 is coupled to a reference potential with a (common) source terminal and substrate terminal (bulk) 300sb. In addition, the EEPROM transistor 300 comprises a floating gate 300fg capacitively coupled to the channel of the EEPROM transistor 300, and a control gate 300cg capacitively coupled to the floating gate 300fg. A PMOS transistor 310 with a drain terminal 310d is coupled to a drain terminal 300d of the EEPROM transistor. The PMOS transistor 310 is connected to a positive supply voltage VDDD with a (common) substrate terminal and source terminal 310sb. In addition, the PMOS transistor 310 comprises a gate terminal 310g, which is driven by a control means not shown in FIG. 4. This control means may, for example, serve for the stabilization and the protection of the linear sensor. A switch 320, also referred to as "sel_eeprom_i" in FIG. 4, which explains the usage purpose of the switch 320 in more detail, is also coupled to the drain terminal 300d of the EEPROM transistor 300. The switch 320 serves for selecting an EEPROM transistor, i.e. the EEPROM transistor 300 in the present case. In the case of a word-based memory, the switch 320 may, for example, be a switch integrated in a row/column converter. In addition, the switch 320 is connected to a first terminal 330-1 of an EEPROM control means 330, also referred to as EEPROM I/O register cell in FIG. 4. At a second terminal 330-2, the EEPROM unit 330 provides an evaluation signal, also referred to as "bit_o" in FIG. 4. Additionally, the EEPROM unit 330 comprises a third terminal 330-3 for a clock signal (clk_i), and a fourth terminal 330-4 for setting a register cell (set_i), and a fifth terminal 330-5 for erasing a register cell (reset_i).

As part of a margin test, a voltage Vmargin (margin voltage or Vmargin voltage) is applied to the control gate 300cg of the EEPROM transistor 300, and there is an evaluation as to whether the EEPROM transistor 300 may draw a predetermined current value, i.e. the read current, and/or whether a predetermined current value may flow through the EEPROM transistor 300 in this case. Here, the read current is impressed to the drain terminal 300d of the NMOS-EEPROM transistor 300 by the PMOS transistor 310. By only varying the voltage Vmargin, which is applied to the control gate terminal 300cg of the EEPROM transistor 300, it is possible to determine a particular Vmargin value, at which the EEPROM transistor 300 draws more than a predetermined read current, i.e. the margin current, whereas at a value slightly below this voltage value and/or Vmargin value the EEPROM transistor 300 draws less than the margin current as read current. If, by closing the switch 320, in both cases the potential at the drain terminal 300d of the EEPROM transistor 300 is digitally evaluated by the EEPROM unit 330 and read out as the bit value bit_o, the bit toggles and/or the EEPROM transistor 300 connects through (through-connection of the EEPROM transistor), when this special Vmargin value is exceeded.

This value of the voltage Vmargin, at which the bit toggles and/or the transistor changes its conductivity and/or connects through, will be referred to below as the effective threshold value (threshold) of the EEPROM transistor 300 and/or effective limit voltage value of the EEPROM transistor 300.

If there is no excess charge and/or no charge at the and/or on the floating gate 300fg of the EEPROM transistor 300, the bit toggles at an effective threshold voltage value, which is also referred to as UV voltage and/or UV level. This name was chosen because, in previous EEPROM memories and/or EPROM memories, the floating gate had to be exposed to ultraviolet radiation for erasing a memory charge on the floating gate. The more charge is on the floating gate, the larger is the difference between the effective threshold voltage Vth,eff and the UV level, wherein the following relationship applies:

$$Vth,eff - UV = Q/Ceff$$

The term Vth,eff is the effective threshold voltage value, the term UV is the UV level and/or the UV voltage value, the term Q is the stored charge at the and/or on the floating gate, and the term Ceff is an effective capacitance resulting from a parallel connection of the capacitance between the gate electrodes and the channel of the transistor and the launch capacitance between the control gate and the floating gate. The difference between the effective threshold voltage value Vth, eff and the UV level UV is thus equal to the charge Q stored on the floating gate divided by the effective capacitance Ceff. The result is that the effective threshold voltage value Vth,eff is a measure for the memory charge Q at the floating gate of the transistor, if the (design-typical) UV level of an EEPROM transistor in a particular technology is known.

Thus, a difference with respect to the connection and/or voltage choice of the memory cell including the EEPROM transistor 300 in the test operation mode and/or in the margin test as compared to the normal readout of the EEPROM transistor 300 in normal operation (normal operation mode) is that, in the margin test, the voltage at the control gate 300cg is given externally while, in the normal operation mode, it is generated on the chip, i.e. on-chip.

Basically, there are implementations of the margin test in which the read current assumes a higher or a lower value during the margin test than in the normal operation mode, however this is not important for the subsequent considerations and the already discussed considerations.

In addition, the margin test may be executed in various more complex forms. On the one hand, the Vmargin voltage may, for example, be changed in small steps to determine the value of the effective threshold voltage as exactly as possible. This is necessary, for example, if, as part of a qualification, an assessment is to be obtained as to how large a charge loss is in a particular device due to diverse stresses. Such stresses may, for example, consist in storage at a high and/or elevated temperature as compared to usual temperatures.

A further, less complex form of a margin test is that only two different voltage levels are used as margin voltage (Vmargin). In that way, there is only a check whether the effective threshold voltage is within these two values or below the lower one or above the higher one of the two values. A margin test of this more simple type is performed, for example, to ensure prior to starting up an EEPROM memory 130 that the stored information may be read out in a sufficiently reliable way in normal operation and/or in operation mode.

The first one of the two margin test variants, i.e. the margin test in which the margin voltage is changed in small steps, is relatively complex because it requires applying many slightly incremented voltage values to the EEPROM transistor 300 and determining the effective threshold voltage value Vth,eff for each memory cell and/or bit cell of the memory. This test may be accelerated by supplying the voltage supplied to the linear sensor 100 via the programming terminal 180 to all control gate terminals of the memory cells and/or the EEPROM transistors in the form of the test signal. This particular connection may require a different connection as compared to a normal programming mode of the memory 130, in which a higher voltage for programming is normally only applied to the respective memory cell.

As part of a margin test, the margin voltage is thus applied to the same pin to which there is also applied a programming voltage. In the case of the margin test, the margin voltage is connected through to the control gate 300cg of the EEPROM transistor 300 by the same switches, as it also occurs in the programming case with the programming circuit. As soon as the voltage at the pin has stably settled, a trigger impulse and/or latch impulse is communicated to the IC device and/or the linear sensor 100, with which the potential at the drain terminal 300d of the EEPROM transistor 300 is digitally evaluated by the EEPROM unit 330. Then, this digital value is passed on and/or communicated to the outside via the data interface of the IC and/or the data terminal 150 of the linear sensor 100.

Among other things, the integrated circuitry 100 according to an embodiment and the test means 200 according to an embodiment, thus, allow a variant with which the margin test may be performed very quickly without resulting in a significant corruption or any corruption at all of the effective threshold values Vth,eff due to too little waiting time prior to the completion of the settling time of the margin voltage.

Summarizing, it is thus possible to accelerate the margin test with the help of the concept according to an embodiment. Use is made of the fact that, in linear sensors 100, a (highly precise) voltage corresponding to the determined sensor value of the linear sensor 100 is output to the out pin and/or the output terminal 140 by the operational amplifier 170. In most cases, as it is also shown in FIG. 1, this operational amplifier 170 is driven by a digital/analog converter 160 and/or DAC 160. In most cases, the operation amplifier 170 is a rail-to-rail type. This means that the operational amplifier 170 may output, for example, voltage values from about 150 mV (typically 100-200 mV) to close to an operating voltage VDD of the linear sensor 100. More specifically, the operational amplifier 170 is capable of outputting voltages up to a maximum value of about 150 mV below the operating voltage value VDD (VDD-150 mV) in this case.

As has already been described in detail in connection with FIGS. 1, 2 and 3, this allows the following margin test without great effort. First, a digital code is communicated to the IC device of the linear sensor 100 via the data terminal 150 and/or via its interface, which is applied to the digital/analog converter 160. Corresponding to the digital code, the digital/analog converter 160 generates a highly precise voltage at the out pin and/or at the output terminal 140 of the linear sensor 100. This voltage may be measured externally for control purposes, as it is shown in FIG. 2 in the form of the optional voltmeter 230. At the same time, however, the voltage generated by the operational amplifier 170 is connected through to the control gate 300cg of the EEPROM transistor 300 to be examined via the switches activated in the margin test. By an external pulse, for example in the form of a read-out pulse and/or latch impulse, or after the expiry of a time determined on the chip (on-chip), the potential at the drain terminal 300d of the EEPROM transistor 300 is digitally evaluated, which is also referred to as "latching" or "latch process".

In order to be able to perform the thus described test, it is, of course, necessary that both the digital/analog converter 160 and the operational amplifier 170 have a sufficiently high accuracy. On the one hand, this requires that the two components are sufficiently accurate due to their specifications, and on the other hand that the two components themselves have been checked as to their compliance with their specifications prior to performing the actual margin test, for example as part of a function analysis. In order to additionally further reduce the insecurities when performing the margin test and to ideally eliminate them completely, it is possible to have the margin voltage value (Vmargin) also measured at the respective pin (output terminal 140), for example by the voltmeter 230 shown in FIG. 2. Since linear sensors generally have components operating in an extremely exact way depending on the application, it is thus particularly advantageous in the present concept according to an embodiment to use exactly these components, i.e. particularly the digital/analog converter 160 and the operational amplifier 170.

Furthermore, it is necessary to perform the margin test at operating voltages which are sufficiently high. If, for example, the effective threshold voltage value of a programmed bit is typically 3.4 volt depending on the design, and a distribution of threshold voltage values related to a plurality of corresponding memory cells, i.e. corresponding EEPROM transistors 300, comprises a Gauss distribution with a standard deviation of 200 mV, there may be, for example, maximum threshold voltage values of about $$3.4\,V + 5 \cdot 0.2\,V = 4.4\,V.$$

For the operational amplifier 170 to be able to output this voltage with sufficient accuracy at the output terminal 140, the operating voltage VDDD of the linear sensor 100 must thus be at least 4.5 V in this example.

The concept according to an embodiment, thus, allows keeping the settling time of the digital/analog converter 160 and the operational amplifier 170 low by having capacitances as low as possible at the respective pin (output terminal 140) during the margin test. In the concept according to an embodiment, this can be achieved by keeping the cable paths and/or the contact paths between the terminals of the IC device very short. In the concept according to an embodiment, this is allowed by the usage of a short, so that the waiting time until the digital evaluation is triggered, i.e. until the bit may be latched, may be set significantly shorter.

A further form of the margin test is to further automate the margin test. Assuming a suitable design of the processor 110, it is thus, for example, possible to input a margin voltage initial value to the linear sensor 100 in the form of a digital code. The linear sensor 100 and/or the IC device then applies itself a Vmargin ramp with a step width that is fixed, predetermined or communicated by a further (digital) code via the processor 110, performs the evaluation of the memory cells, i.e. latches all bits of the EEPROM memory 130 for each Vmargin voltage step, and communicates the results of the evaluation to the outside to the connected tester 200 via its interface, data terminal 150 or evaluation signal output 190 (depending on the implementation of the integrated circuitry 100).

According to a further embodiment, based on the one described above, a value has to be communicated to the outside to the tester 200 via the data terminal 150 only if at least one further bit and/or one further memory cell has toggled, i.e. has changed its value, since the last communication, i.e. since the last time. In this case, the evaluation signal output by the processor 110 and/or the storage means 130 comprises address information in the form of digital values. In this case, the algorithm resulting in a step-wise increase of the Vmargin voltage values may be interrupted and/or stopped, as soon as all memory cells and/or all bits are toggled or a maximum voltage has been reached.

According to a further embodiment of the margin test, the margin voltage Vmargin is generated by the digital/analog converter 160 and the operational amplifier 170, but is connected through directly to the storage means 130 and/or directly to the one or more control gates 300cg of the respective EEPROM transistors 300 avoiding the out pins (output terminal 140). In a practical realization, further high-voltage switches (switches suitable for high voltages of typically up to 50 V) must be provided, for example, in a corresponding implementation, which disconnect the operational amplifier 170 from the output terminal 140, i.e. from the respective pin. This allows achieving a further reduction of parasitic effects, for example the occurrence of (parasitic) capacitances. The additional circuit complexity in the form of a more complex circuit may be justified, if a further acceleration of the margin test can be achieved thereby.

Especially in the case of "smaller" ICs, which typically have a total area of less than 10 mm² and preferably of 5 mm² or less, an effort is made to reduce the number of pins and/or terminals to save space. Each pin of the chip being bonded requires an associated pad comprising an area of about 100 µm×100 µm, as well as additional ESD protection structures (ESD=electrostatic discharge). In addition, the pin itself is a large cost factor, even more so as it enlarges the package, i.e. the integrated circuit after the completion of the package process, because a fourth pin requires additional space and thus also results in a larger package as compared to a package with three pins.

In addition, pins are always a reliability risk. Thus, there is a higher risk that the bonding, i.e. the electrically conductive connection between the pin and the pad associated therewith on the chip, will break with lifetime stresses, particularly with elevated temperatures. In addition, the mechanical stresses from the print plate into the package also increase due to the larger "footprint". In addition to an acceleration of the margin test, the optional connection of the output means 120 to the memory 130, shown as a dashed line in FIG. 1, provides an important possibility to minimize the number of pins and thus the costs and to additionally increase the reliability.

The concept according to an embodiment for testing an integrated circuitry 100 with a memory 130 thus allows using a pin, i.e. the output terminal 140 in the embodiment shown in FIG. 1, in three ways. The respective pin may be used 1. for outputting a highly accurate signal (processed output signal in the current domain or in the voltage domain), 2. for programming, wherein a programming impulse is applied from the outside to the respective pin, and 3. in the field of a margin test.

The concept according to an embodiment, thus, allows to accelerate the programming input and the margin test input with the help of a multifunctional pin, i.e. a common pin for the linear output of the sensor.

In the case of a margin test, the margin voltage (margin test voltage) is generated by parts of the signal path of the linear sensor 100, specifically the digital/analog converter 160 and the operational amplifier 170, applied to the respective pin and switched on to the storage medium in the form of the memory 130, so that an evaluation of the storage medium and/or the memory 130 may be performed with respect to its charge contents.

Basically, the concept and/or principle described in the present application may also be applied to storage media other than EEPROM memory cells, if these store the stored information in the form of an analog value. Examples thereof are thus not only the already discussed EEPROM memories, but also the storage of information by an alterable resistance, an alterable magnetization or other alterable, analog quantities. In these cases, a memory cell and/or a bit is considered to be programmed or non-programmed when the analog, alterable quantity exceeds or falls below certain limits.

The present invention thus concerns a built-in self-test (BIST) for integrated circuitries for the performance of a margin test on an EEPROM memory with a magnitude between 10 bits and about 1000 bits. The present invention is thus particularly applicable to integrated circuitries, which also comprise ASICs (application-specific integrated circuits), i.e., for example, intelligent and/or integrated sensors adjusted in their assembly.

Depending on the circumstances, the method according to an embodiment for testing an integrated circuitry may be implemented in hardware or in software. The implementation may be done on a digital storage medium, particularly a floppy disc or CD with control signals that may be read out electronically, which may cooperate with a programmable computer system so that the method for testing an integrated circuitry according to an embodiment is executed. In general, the invention thus also consists in a computer program product with a program code stored on a machine-readable carrier for performing the inventive method when the computer program product runs on a computer. In other words, the invention may thus be realized as a computer program with a program code for performing the method when the computer program runs on a computer.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An integrated circuitry operable in a normal operation mode and in a test operation mode, comprising:

processing circuit means;

output circuit means associated with the processing circuit means; and storage means with a plurality of memory cells, wherein the output circuit means is formed to process an output signal, in the normal operation mode, from the processing circuit means and provide a processed output signal at an output terminal of the integrated circuitry;

wherein the output circuit means is further formed to provide, in the test operation mode, a test signal as the processed output signal based on a drive signal that may be supplied externally or from the processing circuit means;

wherein the storage means is formed to receive, in the test operation mode, the test signal and perform an evaluation of a memory property of at least one memory cell of the plurality of memory cells based on the test signal, and, in response to this evaluation, to output an evaluation signal indicating the memory property of the at least one memory cell of the plurality of memory cells.

2. The integrated circuitry of claim 1, wherein the storage means is formed to be programmable in a programming mode.

3. The integrated circuitry of claim 2, wherein the integrated circuitry is further formed to couple the output terminal to the storage means in the programming mode, so that the storage means is programmable by applying a programming signal to the output terminal, and to couple the output terminal to the storage means in an external test operation mode, so that an external test signal may be provided to the storage means to perform an evaluation of a memory property of at least one memory cell of the plurality of memory cells based on the external test signal.

4. The integrated circuitry of claim 2, wherein the memory cell includes an EEPROM cell with a drain terminal, a source terminal and a substrate terminal and a control gate terminal, and wherein the storage means is formed to make the programming signal or a signal derived from the programming signal applicable to the control gate terminal.

5. The integrated circuitry of claim 4, wherein the storage means is formed to output a potential at the drain terminal or a source terminal of the EEPROM cell.

6. The integrated circuitry of claim 1, wherein the integrated circuitry comprises a programming terminal for receiving a programming signal.

7. The integrated circuitry of claim 6, wherein the programming terminal and the output terminal are electrically connectable by a low-resistance connection to provide the test signal to the storage means.

8. The integrated circuitry of claim 1, wherein the storage means is formed to output a logical signal as an evaluation signal which indicates a change of contents of a memory cell of the plurality of memory cells.

9. The integrated circuitry of claim 1, wherein the storage means is formed to output an address signal of a memory cell of the plurality of memory cells as an evaluation signal which indicates a change of contents of the memory cell of the plurality of memory cells.

10. The integrated circuitry of claim 1, wherein the integrated circuitry comprises a drive terminal which may be coupled to the processing circuit means or the output circuit means to supply a drive signal to the output circuit means directly or via the processing circuit means.

11. The integrated circuitry of claim 1, wherein the storage means is coupled to the processing circuit means to read data stored in the storage means and to generate the output signal taking into account the data stored in the storage means.

12. The integrated circuitry of claim 1, wherein the integrated circuitry is part of a linear sensor.

13. A test means for testing an integrated circuitry operable in a normal operation mode and in a test operation mode, comprising processing circuit means; output circuit means associated with the processing circuit means; and storage means with a plurality of memory cells, wherein the output circuit means is formed to process, in the normal operation mode, an output signal from the processing circuit means and provide a processed output signal at an output terminal of the integrated circuitry; wherein the output circuit means is further formed to provide, in the test operation mode, a test signal as the processed output signal based on a drive signal that may be supplied externally or from the processing circuit means; wherein the storage means is formed to receive, in the test operation mode, the test signal and perform an evaluation of a memory property of at least one memory cell of the plurality of memory cells based on the test signal, and, in response to this evaluation, to output an evaluation signal indicating the memory property of the at least one memory cell of the plurality of memory cells, the test means comprising:
    drive signal generation means formed to generate the drive signal and to provide it to the integrated circuitry; and
    evaluation signal detection means formed to detect the evaluation signal of the storage means.

14. The tester of claim 13 for testing an integrated circuitry, further comprising a programming terminal coupled to the storage means, comprising:
    a low-resistance connection coupling the programming terminal and the output terminal to each other.

15. A method for testing an integrated circuitry operable in a normal operation mode and in a test operation mode, comprising processing circuit means; output circuit means associated with the processing circuit means; and storage means with a plurality of memory cells, wherein the output circuit means is formed to process, in the normal operation mode, an output signal from the processing circuit means and provide a processed output signal at an output terminal of the integrated circuitry; wherein the output circuit means is further formed to provide, in the test operation mode, a test signal as the processed output signal based on a drive signal that may be supplied externally or from the processing circuit means; wherein the storage means is formed to receive, in the test operation mode, the test signal and perform an evaluation of a memory property of at least one memory cell of the plurality of memory cells based on the test signal, and, in response to this evaluation, to output an evaluation signal indicating the memory property of the at least one memory cell of the plurality of memory cells, the method comprising:
    providing the integrated circuitry;
    providing the drive signal; and
    detecting the evaluation signal.

16. The method of claim 15 for testing the integrated circuitry further comprising a programming terminal for receiving a programming signal, the method additionally comprising:
    connecting the programming terminal and the output terminal to each other by a low-resistance connection.

17. A computer program product comprising a program code stored on a computer readable medium, said program code when executed on a computer performing a method for testing an integrated circuitry operable in a normal operation mode and in a test operation mode, wherein the integrated circuitry has processing circuit means; output circuit means associated with the processing circuit means; and storage means with a plurality of memory cells, wherein the output circuit means is formed to process, in the normal operation mode, an output signal from the processing circuit means and provide a processed output signal at an output terminal of the integrated circuitry; wherein the output circuit means is further formed to provide, in the test operation mode, a test signal as the processed output signal based on a drive signal that may be supplied externally or from the processing circuit means; wherein the storage means is formed to receive, in the test operation mode, the test signal and perform an evaluation of a memory property of at least one memory cell of the plurality of memory cells based on the test signal, and, in response to this evaluation, to output an evaluation signal indicating the memory property of the at least one memory cell of the plurality of memory cells, the method comprising:
- providing the integrated circuitry;
- providing the drive signal; and
- detecting the evaluation signal.

18. An integrated circuitry operable in a normal operation mode and in a test operation mode, comprising:
- processing circuit means;
- output circuit means associated with the processing circuit means; and
- storage means with a plurality of memory cells,
- wherein the output circuit means is formed to, in the normal operation mode, process an output signal from the processing circuit means and provide an analog processed output signal based on the output signal at an output terminal of the integrated circuitry;
- wherein the output circuit means is further formed to, in the test operation mode, provide a test signal as the analog processed output signal based on a drive signal that may be supplied externally or from the processing circuit means;
- wherein the storage means is formed to, in the test operation mode, receive the test signal and perform an evaluation of a memory property of at least one memory cell of the plurality of memory cells based on the test signal, and, in response to this evaluation, to output an evaluation signal indicating the memory property of the at least one memory cell of the plurality of memory cells.

* * * * *